United States Patent
Lee

(10) Patent No.: US 11,609,869 B2
(45) Date of Patent: Mar. 21, 2023

(54) SYSTEMS, METHODS, AND DEVICES FOR TIME SYNCHRONIZED STORAGE DELIVERY

(71) Applicant: Samsung Electronics Co., Ltd., Suwon-si (KR)

(72) Inventor: Ronald C. Lee, Pleasanton, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 242 days.

(21) Appl. No.: 17/154,444

(22) Filed: Jan. 21, 2021

(65) Prior Publication Data

US 2022/0019546 A1    Jan. 20, 2022

Related U.S. Application Data

(60) Provisional application No. 63/051,883, filed on Jul. 14, 2020.

(51) Int. Cl.
| | |
|---|---|
| *G06F 13/16* | (2006.01) |
| *G06N 20/00* | (2019.01) |
| *H03M 13/15* | (2006.01) |
| *G06F 16/245* | (2019.01) |

(52) U.S. Cl.
CPC ........ *G06F 13/1668* (2013.01); *G06F 16/245* (2019.01); *G06N 20/00* (2019.01); *H03M 13/154* (2013.01)

(58) Field of Classification Search
CPC ... G06F 13/1668; G06F 16/245; G06N 20/00; H03M 13/154
See application file for complete search history.

(56) References Cited

U.S. PATENT DOCUMENTS

| | | | |
|---|---|---|---|
| 9,825,652 | B1 | 11/2017 | Lazier |
| 10,585,749 | B2 | 3/2020 | Kachare et al. |
| 2017/0308321 | A1 | 10/2017 | Kumagai et al. |
| 2019/0188079 | A1 | 6/2019 | Kohli |
| 2019/0317803 | A1* | 10/2019 | Maheshwari ....... G06F 16/2358 |
| 2019/0325081 | A1* | 10/2019 | Liu ......................... H04L 41/20 |
| 2020/0167258 | A1* | 5/2020 | Chattopadhyay ........ G06N 3/08 |
| 2020/0204569 | A1* | 6/2020 | Komarek .................. G06N 3/08 |

* cited by examiner

*Primary Examiner* — Henry Tsai
*Assistant Examiner* — John B Roche
(74) *Attorney, Agent, or Firm* — Lewis Roca Rothgerber Christie LLP

(57) ABSTRACT

A method includes receiving, at a first computing device, a first input/output (IO) command from a first artificial intelligence processing unit (AI PU), the first IO command associated with a first AI model training operation. The method further includes receiving, at the first computing device, a second IO command from a second AI PU, the second IO command associated with a second AI model training operation. The method further includes assigning a first timestamp to the first IO command based on a first bandwidth assigned to the first AI model training operation. The method further includes assigning a second timestamp to the second IO command based on a second bandwidth assigned to the second AI model training operation.

26 Claims, 9 Drawing Sheets

SYSTEMS, METHODS, AND DEVICES FOR TIME SYNCHRONIZED STORAGE DELIVERY

PRIORITY

This application claims priority to U.S. Provisional Patent application 63/051,883, filed Jul. 14, 2020, the contents of which are hereby incorporated by reference in their entirety.

BACKGROUND

Artificial intelligence (AI) models (e.g., variational autoencoders) are trained using large data sets. An AI system may include many thousands of graphics processing units (GPUs) configured to process the large data sets in parallel to properly train one or more AI models.

SUMMARY

Storage systems and methods for performing time synchronized storage delivery are disclosed. These systems and methods may be used to support processing large data sets during training of artificial intelligence models.

A method includes receiving, at a first computing device, a first input/output (IO) command from a first artificial intelligence processing unit (AI PU), the first IO command associated with a first AI model training operation. The method further includes receiving, at the first computing device, a second IO command from a second AI PU, the second IO command associated with a second AI model training operation. The method further includes assigning a first timestamp to the first IO command based on a first bandwidth assigned to the first AI model training operation. The method further includes assigning a second timestamp to the second IO command based on a second bandwidth assigned to the second AI model training operation.

A method includes receiving, at a storage device, a first request for a first data chunk, the first request including a first timestamp and a first global flow identifier (GFID). The method further includes receiving, at the storage device, a second request for a second data chunk, the second request including a second timestamp and a second GFID. The method further includes identifying, at the storage device, a first artificial intelligence (AI) model processing unit based on the first GFID. The method further includes identifying, at the storage device, a second AI model processing unit based on the second GFID. The method further includes sending, from the storage device, the first data chunk to the first AI model processing unit, where timing of transmission of the first data chunk is based on the first timestamp. The method further includes sending, from the storage device, the second data chunk to the second AI model processing unit, where timing of transmission of the second data chunk is based on the second timestamp.

A computing device includes a network interface and a processor unit. The processor unit is configured to receive a first input/output (IO) command from a first artificial intelligence processing unit (AI PU), the first IO command associated with a first AI model training operation. The processor unit is further configured to receive a second IO command from a second AI PU, the second IO command associated with a second AI model training operation. The processor unit is further configured to assign a first timestamp to the first IO command based on a first bandwidth assigned to the first AI model training operation. The processor unit is further configured to assign a second timestamp to the second IO command based on a second bandwidth assigned to the second AI model training operation.

A storage device includes a network interface and a processor unit. The processor unit is configured to receive a first request for a first data chunk, the first request including a first timestamp and a first global flow identifier (GFID). The processor unit is further configured to receive a second request for a second data chunk, the second request including a second timestamp and a second GFID. The processor unit is further configured to identify a first artificial intelligence (AI) model processing unit based on the first GFID. The processor unit is further configured to identify a second AI model processing unit based on the second GFID. The processor unit is further configured to initiate transmission of the first data chunk to the first AI model processing unit through the network interface, where timing of transmission of the first data chunk is based on the first timestamp. The processor unit is further configured to initiate transmission of the second data chunk to the second AI model processing unit through the network interface, where timing of transmission of the second data chunk is based on the second timestamp.

DETAILED DESCRIPTION

Figure 1:
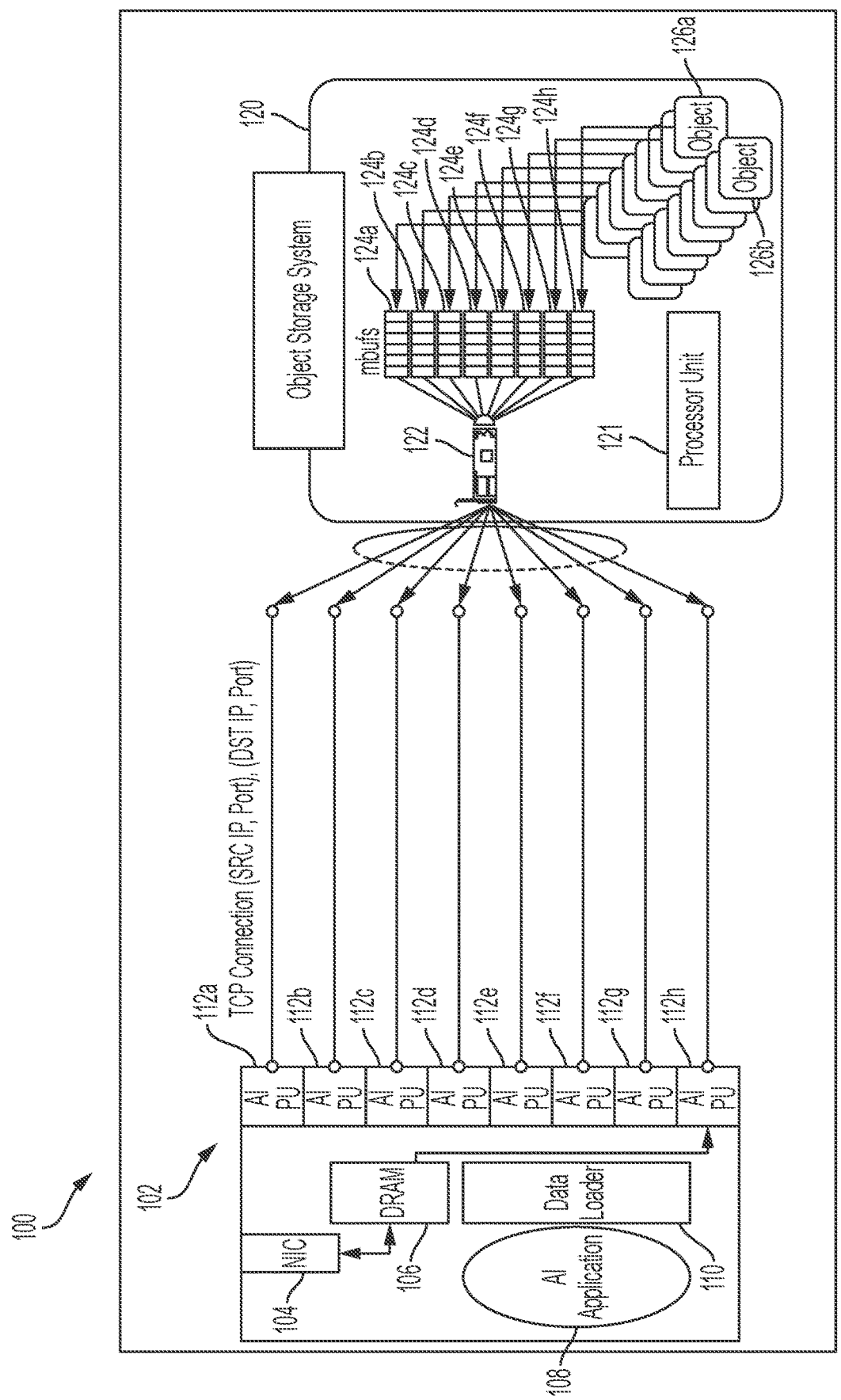
FIG. 1 is a diagram of a system for performing time synchronized storage delivery.

Referring to FIG. 1, a diagram of a system 100 for time synchronized storage delivery is shown. The system 100 includes an artificial intelligence (AI) host device 102. The AI host device 102 may correspond to one or more computing devices. The AI host device 102 includes an AI application 108 and a data loader 110. The AI application 108 and the data loader 110 may correspond to software executable by a processor (not shown) of the AI host device 102. The AI host device 102 further includes a network interface controller (NIC) 104, a dynamic random access memory (DRAM) 106, and a plurality of AI model processing units (AI PUs) 112*a-h*. The NIC 104 may correspond to a wireless or a wired NIC. The plurality of AI PUs includes a first AI PU 112*a*, a second AI PU 112*b*, a third AI PU 112*c*, a fourth AI PU 112*d*, a fifth AI PU 112*e*, a sixth AI PU 112*f*, a seventh AI PU 112*g*, and an eighth AI PU 112*h*. 8 AI PUs 112 *a-h* are shown in this example embodiment, but any number may be used. The plurality of AI PUs 112*a-h* may include one or more graphics processor units (GPUs), one or more applications executable by a processor, a field programmable gate array (FPGA), an application specific integrated circuit (ASIC), a central processor unit (CPU), another processing component, or a combination thereof. In some examples, the AI PUs 112 a-h may be configured to process workloads associated with AI operations. In some examples, the workloads may include matrix multiplication and/or convolution intensive operations. The AI host device 102 may correspond to a physical device or a virtual device (e.g., implemented by cloud computing system).

In some implementations, the AI host device 102 is configured differently than the example illustrated in FIG. 1. For example, the DRAM 106 may be replaced with a different type of memory unit (e.g., a static random access memory SRAM, etc.). As another example, the NIC 104 may be replaced with a different type of network adapter. As another example, the AI host device 102 may include a different number of GPUs than illustrated. Further, the AI host device 102 may include additional components that are not illustrated in FIG. 1. For example, the AI host device 102 may include one or more processors configured to execute instructions corresponding to the AI application 108, the data loader 110, the AI PUs 112a-h, or a combination thereof.

The system 100 further includes an object storage system 120. The object storage system 120 may correspond to one or more computing devices. In some implementations, the object storage system 120 corresponds to a server (e.g., an object storage server). Such a "server" may be a physical device or a virtual device (e.g., implemented by cloud computing system).

The object storage 120 system includes a NIC 122, a processor unit 121, and memory buffers 124a-h. In some implementations, the object storage system 120 includes a number of buffers 124a-h equal to a number of AI PUs included in the AI host device 102. In other implementations, the object storage system 120 includes a different number of buffers. The processor unit 121 may correspond to a field programmable gate array configured to perform the described actions, a central processor unit configured to execute instructions stored in a memory device (not shown) to perform the described actions, an application specific integrated circuit configured to perform the described actions, or other processing device. The NIC 122 may correspond to a wireless or wired NIC. The memory buffers 124a-h may correspond to memory spaces within one or more memory devices. Such memory devices may in include DRAM, SRAM, another type of memory, or a combination thereof. In the illustrated example, the memory buffers 124a-h include a first memory buffer 124a, a second memory buffer 124b, a third memory buffer 124c, a fourth memory buffer 124d, a fifth memory buffer 124e, a sixth memory buffer 124f, a seventh memory buffer 124g, and an eighth memory buffer 124h. Each of the memory buffers 124a-h may be associated with a different priority level. For example, the first memory buffer 124a may be associated with a first priority level and the second memory buffer 124b may be associated with a second priority level. In other examples, the object storage system 120 may include a different number of memory buffers.

Each of the AI PUs 112a-h has a separate connection to the NIC 122. In some implementations, these connections are maintained through the NIC 104 of the AI host device 102. In other implementations the connections are maintained through separate network adapters of the AI PUs 112a-h. The connections may be direct or may be through a public network (e.g., the Internet), a private network, or a combination thereof. The AI PUs 112a-h are configured to send input/output (IO) commands to the object storage system 120 through the connections. For example, the first AI PU 112a may send a first IO command requesting a first data object to the object storage system 120. The AI PUs are configured to train one or more AI data models based on retrieved data objects. For example, in response to receiving the first data object, the first AI PU 112a may train an AI model (or portion thereof) and return the trained model (or portion thereof) to the AI application 108.

The processor unit 121 of the object storage system 120 is configured to buffer received commands in the memory buffers 124a-h based on global flow identifiers (GFIDs) included in the received IO commands, as described further herein. The processor unit 121 of the object storage system 120 is configured to retrieve the IO commands and initiate associated data operations based on the priority of the memory buffers 124a-h. For example, the processor unit 121 of the object storage system 120 may retrieve IO commands from the first memory buffer 124a more frequently than from the second memory buffer 124b based on relative priority levels of the first and second memory buffers 124a, 124b.

The processor unit 121 of the object storage system 120 manages data objects 126a, b. In FIG. 1, a first data object 126a and a second data object 126b are labeled. The received IO commands may identify data objects (e.g., by key values). The processor unit 121 of the object storage system 120 may be configured to initiate time synchronized transfer of two or more data objects to one or more AI PUs, as described further herein. The data objects 126 managed by the object storage system 120 may be stored in one or more storage devices. These storage devices may be connected to the object storage system 120 through the NIC 122. Accordingly, initiating a transfer of a data object may include sending a request to a storage device to transfer the object (or a portion thereof) to the object storage system 120 or to a requesting AI PU.

In some implementations, the processor unit 121 of the object storage system 120 is configured to implement a data erasure coding scheme. The processor unit 121 of the object storage system 120 may perform the data erasure coding scheme to data objects to generate one or more erasure coded (EC) chunks and store the EC chunks on one or more storage devices. In response to an IO command referencing a data object, the processor unit 121 of the object storage system 120 may be configured to determine which storage device or storage devices store EC chunks for the data object and to issue IO requests to those storage devices.

In some implementations, the storage devices include non-volatile memory express (NVMe) devices, NVMe over fabric (NVMe-oF) targets, other storage devices, or a combination thereof.

Figure 2:
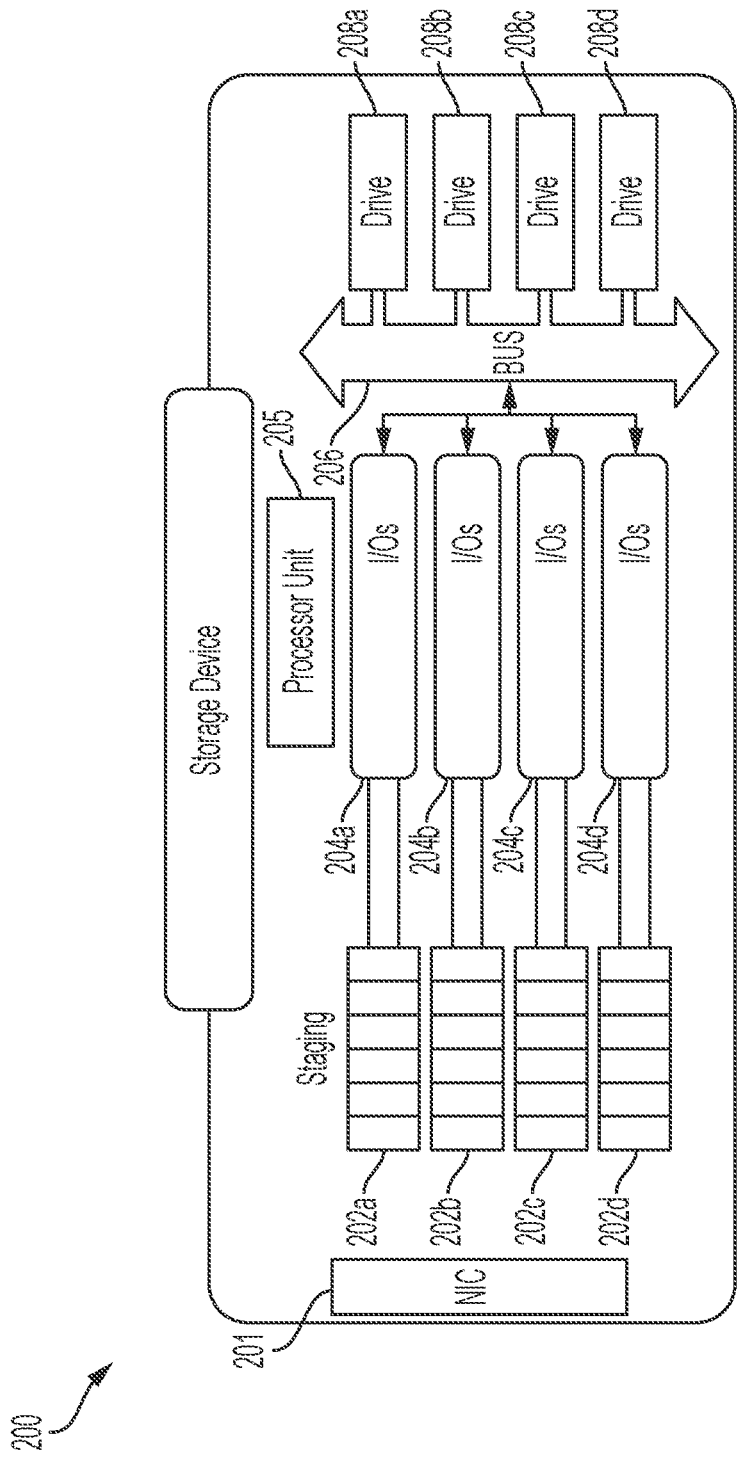
FIG. 2 is a diagram of a storage device for performing time synchronized storage delivery.

FIG. 2 depicts an example of a storage device 200 (e.g., an NVMe-oF target) that may store EC coded chunks of one or more data objects. The storage device 200 includes a NIC 201 and processor unit 205. The NIC 201 may correspond to a wireless or wired NIC. The processor unit 205 may correspond to a field programmable gate array configured to perform the described actions, a central processor unit configured to execute instructions stored in a memory device (not shown) to perform the described actions, an application specific integrated circuit configured to perform the described actions, or other processing device. The storage device 200 includes a first drive 208a, a second drive 208b, a third drive 208c, and a fourth drive 208d. Each of the drives 208a-d may include a solid state drive, a hard disk drive, a different kind of computer storage drive, or a combination thereof. The drives 208a-d are configured to store data (e.g., EC encoded data chunks). In some implementations, the storage device 200 includes a different number of drives than shown in FIG. 2.

The storage device 200 includes a first staging buffer 202a, a second staging buffer 202b, a third staging buffer 202c, and a fourth staging buffer 202d. Other implementations may include a different number of staging buffers. The staging buffers 202a-d may include DRAM, SRAM, another type of memory, or a combination thereof. The staging buffers are configured to store IO requests received from the object storage system 120 via the NIC 201, store data (e.g., EC encoded data chunks) retrieved from the drives 208a-d, or a combination thereof. For example, all of the staging buffers 202a-d may be configured to store IO requests received from the object storage system 120, all of the staging buffers 202a-d may be configured to store data chunks from the drives, or a first subset of the staging buffers 202a-d may be configured to store data chunks and a second subset of the staging buffers 202a-d may be configured to store IO requests. In some implementations, the storage device 200 includes one buffer per drive included in the storage device 200. In other implementations the storage device 200 includes a different number of buffers (e.g., one buffer per drive plus one or more output buffers).

In implementations, in which one or more of the staging buffers are configured to receive IO requests, the processor unit 205 may assign a particular IO request to a particular one of the staging buffers 202a-d based on a GFID associated with the IO request, as described further herein. The staging buffers 202a-d may have associated priority levels and IO requests stored in the staging buffers 202a-d may be processed from the staging buffers 202a-d in an order determined based on the priority levels. Similarly, in implementations in which one or more of the staging buffers are configured to receive data from the drives 208a-d, the processor unit 205 may assign particular data (e.g., a particular chunk) to a particular one of the staging buffers based on a GFID associated with an IO request associated with retrieval of the particular data, as described further herein. As indicated above, the staging buffers 202a-d may have associated priority levels. Data stored in the staging buffers 202a-d may be sent from the staging buffers 202a-d (e.g., to the object storage system 120 or to one or more of the AI PUs 112a-h) in an order determined based on the priority levels.

The storage device 200 further includes a bus 206. The bus 206 may include a peripheral component interconnect express (PCIe) bus or other type of bus. The bus 206 connects the drives 208a-d with the staging buffers 202a-d. The NIC 201 and/or the processor unit 205 may also be connected to the bus 206. FIG. 2 depicts IOs 204a-d flowing between the drives 208a-d and the staging buffers 202a-d. These IOs 204a-d may include data chunks, IO requests or a combination thereof. In some implementations, the storage device 200 includes additional components that may further be connected to the bus 206.

Figure 3:
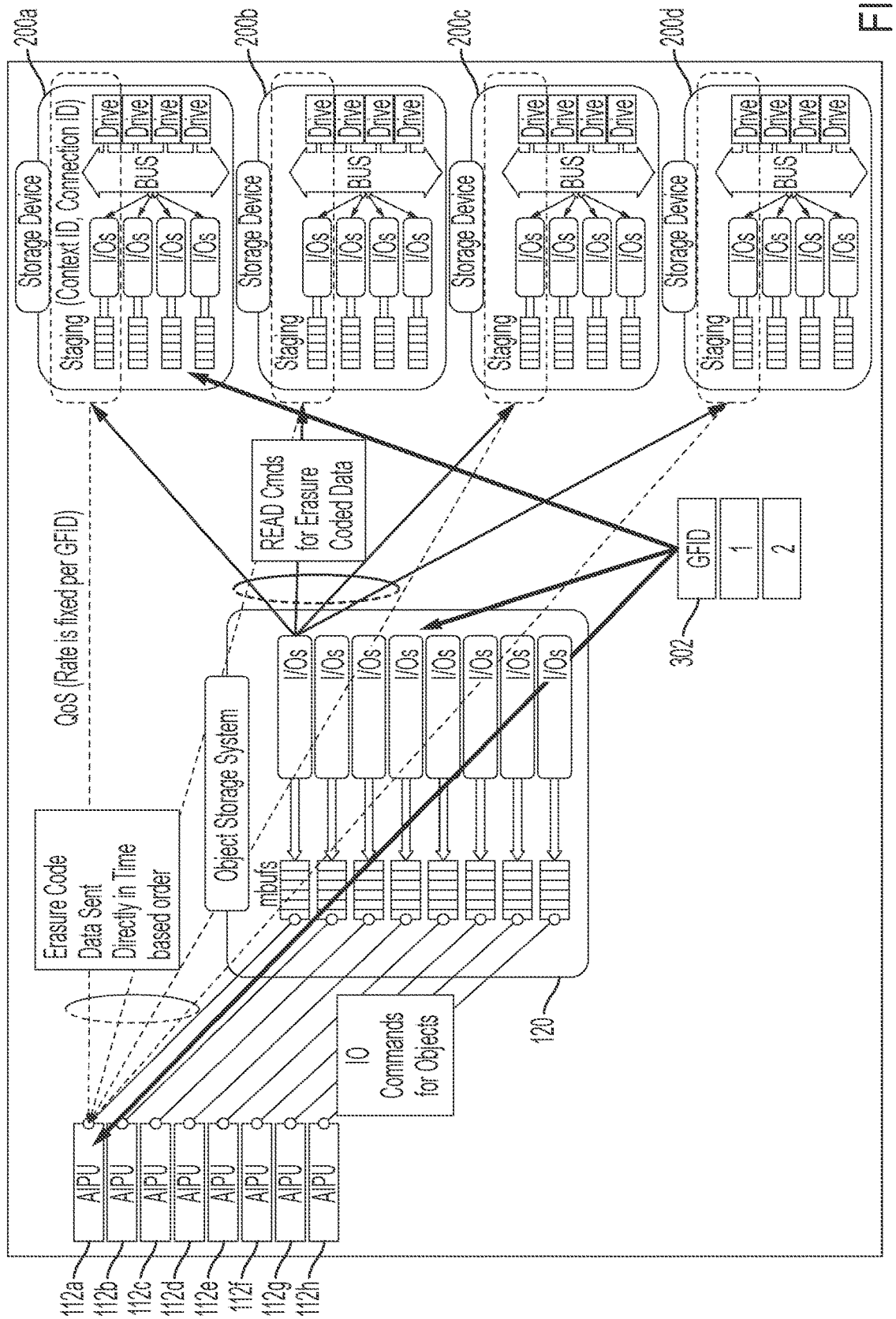
FIG. 3 is another diagram of the system for performing time synchronized storage delivery including a plurality of the storage devices of FIG. 2.

Referring to FIG. 3, a diagram illustrating operation of a system for time synchronized storage delivery is shown. In the example, of FIG. 3, the object storage system 120 and the AI PUs 112a-h of FIG. 1 are connected (e.g., directly or through one or more networks) to storage devices 200a-d. While four storage devices 200a-d are illustrated, in other examples, the object storage system 120 and/or the AI PUs 112a-h may be connected to a different number of storage devices. Further, a different number of AI PUs than shown in the illustrated example may be included in some examples. Each of the storage devices 200a-d is an example of the storage device 200 illustrated in FIG. 2. It should be noted that while the storage devices 200a-d are examples of the storage device 200, the storage devices 200a-d may not be identical. For example, as explained above, the storage device 200 may have different configurations (e.g., different numbers or utilizations of staging buffers, etc.) and the first storage device 200a may have one of these configurations while the second storage device 200b has a second one of these configurations.

Further, the object storage system 120, the AI PUs 112a-h, and the storage devices 200a-d are connected to a GFID database 302 (e.g., the NIC 122 and the NIC 201 respectively). The GFID database 302 is implemented on a computing device. In some examples, the GFID database 302 is implemented on the AI host device 102 of FIG. 1 (e.g., on one of the AI PUs 112a-h or another processor of the AI host device 102). In some examples, the GFID database 302 is implemented on the object storage system 120 or on one of the storage devices 200a-d. In some examples, the GFID database 302 is implemented on a computing device external to the AI-PUs 112a-h, the storage devices 200a-d, and the object storage system 120.

The GFID database 302 is configured to store metadata identifying resources associated with an AI model training session. For example, the GFID database 302 may store an association between a GFID, data associated with an AI PU, data associated with one or more storage devices, and data associated with one or more object storage systems. The data associated with the AI PU may include an identifier of the AI PU, a connection identifier associated with the AI PU, a bandwidth associated with the AI PU, or a combination thereof. The data associated with the one or more object storage systems may include an object storage system identifier for each object storage system, a connection identifier for each object storage system, a bandwidth associated with each object storage system, or a combination thereof. The data associated with the one or more storage devices may include an identifier of each storage device, a connection identifier associated with each storage device, a bandwidth associated with each storage device, or a combination thereof.

Figure 4:
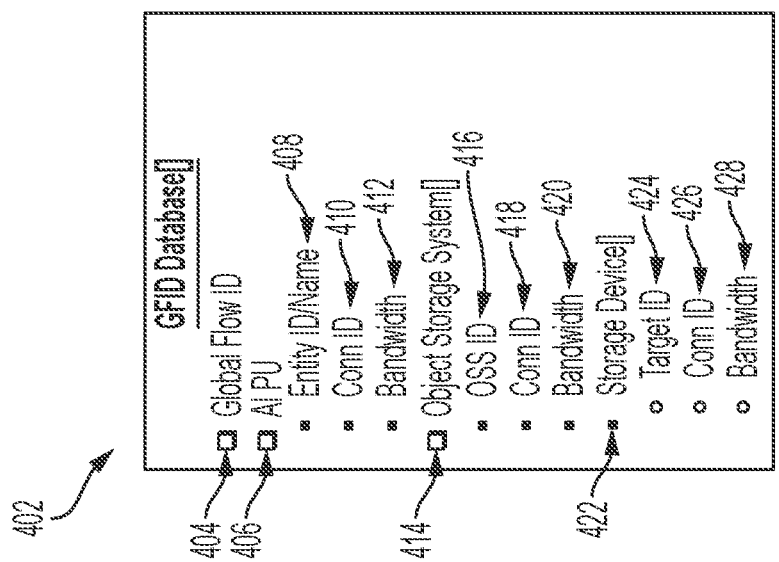
FIG. 4 is a diagram of a global flow identifier database entry.

Referring to FIG. 4, a diagram illustrating an example entry 402 in the GFID database 302 is shown. In the example shown in FIG. 4, the entry 402 includes a global flow ID 404, data 406 associated with an AI PU, data 414 associated with one or more object storage systems, and data 422 associated with one or more storage devices. The global flow ID 404 may be a unique identifier identifying an AI training session (or other data flow).

The data 406 associated with the AI PU is descriptive of an AI PU involved in the AI training session (or other data flow). The data 406 associated with the AI PU includes an entity identifier or name 408. The entity identifier or name 408 may include a network address (e.g., an Internet protocol address), a hostname, another identifier, or a combination thereof. The data 406 further includes a connection identifier 410 associated with the AI PU. The connection identifier 410 may include a socket identifier, other type of connection identifier, or a combination thereof identifying a connection through which the AI PU identified by the entity identifier or name 408 may transmit and/or receive data. The data 406 associated with the AI PU further includes a bandwidth indicator 412. The bandwidth indicator 412 indicates a bandwidth available to the AI PU to receive data during the AI training session (or other data flow).

The data 414 associated with the one or more object storage systems includes an object storage system identifier 416 for each object storage system associated with the AI training session (or other data flow). The object storage system identifier 416 may include a network address (e.g., an Internet protocol address), a hostname, another identifier, or a combination thereof. The data 414 associated with the one or more object storage systems further includes a connection identifier 418 for each object storage system associated with the AI training session (or other data flow). The connection identifier 418 may include a socket identifier, other type of connection identifier, or a combination thereof identifying a connection through which the object storage system identified by the object storage system identifier 416 may transmit and/or receive data. The data 414 associated with the one or more object storage systems further includes a bandwidth indicator 420 for each object storage system associated with the AI training session (or other data flow). The bandwidth indicator 420 indicates a bandwidth available to the object storage system to send and/or receive data during the AI training session (or other data flow).

The data 422 associated with the one or more storage devices includes a target identifier 424 for each storage device associated with the AI training session (or other data flow). The target identifier 424 may include a network address (e.g., an Internet protocol address), a hostname, another identifier, or a combination thereof. The data 422 associated with the one or more storage devices further includes a connection identifier 426 for each storage device associated with the AI training session (or other data flow). The connection identifier 426 may include a socket identifier, other type of connection identifier, or a combination thereof identifying a connection through which the object storage system identified by the target identifier 424 may transmit and/or receive data. The data 422 associated with the one or more storage devices further includes a bandwidth indicator 428 for each storage device associated with the AI training session (or other data flow). The bandwidth indicator 428 indicates a bandwidth available to the storage device to send and/or receive data during the AI training session (or other data flow).

Thus, FIG. 4 depicts an example of an entry in a global flow identifier database that associates a global flow identifier to metadata describing various resources used during an AI training session (or other data flow).

Referring back to FIG. 3, during an AI model training session (or other data flow), the first AI PU 112a (or any other AI PU) may issue an IO command (e.g., a read request) to the object storage system 120. The first AI PU 112a may include a GFID associated with the AI training session (or other data flow) in the IO command. In some implementations, the first AI PU 112a may limit a rate at which IO commands are transmitted to the object storage system 120 based on the bandwidth indicator 420 associated with the object storage system 120 as identified by the GFID database 302.

In response to receiving the IO command, the processor unit 121 of the object storage system 120 may assign a timestamp to the IO command and then place the IO command in one of the memory buffers 124a-h. Assigning a timestamp to the IO command may include adding the timestamp to a record (e.g., a command control block) associated with the IO command. The record may correspond to a block of metadata associated with the IO command. In some examples, the processor unit 121 of the object storage system 120 looks up the GFID in the IO command within the GFID database 302 and determines in which memory buffer to place the IO command based on data associated with the GFID. For example, the processor unit 121 of the object storage system 120 may place the IO command within the first memory buffer 124a based on a bandwidth (e.g., a bandwidth indicated by the bandwidth indicator 412) associated with the first AI PU 112a, as identified in the GFID database 302. In some examples, the processor unit 121 of the object storage system 120 may maintain a mapping of priority levels to bandwidth ranges (e.g., a first bandwidth range may be mapped to a first priority level, a second bandwidth range may be mapped to a second priority level, etc.). The processor unit 121 of the object storage system 120 may identify a bandwidth range within which the bandwidth of the AI PU associated with the GFID identified by the IO command falls and then add the IO command to one of the memory buffers 124a-h that corresponds to a priority level mapped to the bandwidth range.

In some examples, the timestamp assigned by the processor unit 121 of the object storage system 120 to the IO command is based on the GFID (e.g., based on a bandwidth associated with the GFID). For example, the processor unit 121 of the object storage system 120 may look up the GFID in the GFID database 302 to identify a bandwidth associated with an AI PU associated with the GFID and then assign the timestamp based on the bandwidth. For example, the assigned timestamp may correspond to a time the IO command is received by the object storage system 120 plus an offset that is selected based on the bandwidth. To illustrate, the object storage system 120 may receive a first IO command that includes a first GFID and a second IO command that includes a second GFID through the NIC 122. The first GFID may be associated in the GFID database 302 with the first AI PU 112a and the second GFID may be associated in the GFID database 302 with the second AI PU 112b. The entry for the first GFID may further indicate that the bandwidth associated with the first AI PU 112a is X while the entry for the second GFID may indicate that the bandwidth associated with the second AI PU 112b is Y. The object storage system 120 may maintain (e.g., in an external or internal memory) associations (e.g., mappings) between bandwidths and offsets. The processor unit 121 of the object storage system 120 may set a first offset (e.g., +5 milliseconds (ms)) based on X and set a second offset (e.g., +3 ms) based on Y. In another implementation, the processor unit 121 may assign timestamp (n) for a particular IO command associated with a GFID based on the bandwidth for the GFID and based on a previous timestamp (n−1) for a previous IO command associated with the GFID. To illustrate, the processor unit 121 may assign the timestamp n so that a time between timestamp n−1 and timestamp n satisfies a data rate indicated by the bandwidth associated with the GFID. In some implementations, the processor unit 121 assigns timestamps for IO commands associated with a GFID such that an average time between timestamps for the GFID satisfies a bandwidth associated with the GFID (e.g., regardless of when the IO commands are received by the object storage system 120). As explained further below, object storage devices may be configured to use the timestamp to schedule responses to commands. Accordingly, setting the timestamp of an IO command based on a GFID associated with an AI training session may provide priority based scheduling for AI training sessions in which data is exchanged between several devices. This priority scheme may be used to ensure that the system 100 meets bandwidth (e.g., a rate at which an AI PU receives data) and latency (latency refers to a time between an AI PU sending a command and a time at which a response is sent by a storage device 200) requirements of an AI training session.

The processor unit 121 of the object storage system 120 is configured to process an IO command from one of the memory buffers 124a-h by removing the IO command from the memory buffer 124a-h and identifying which of the storage devices 200a-d store data (e.g., a data chunk) indicated by the IO command. The processor unit 121 of the object storage system 120 is configured to generate a request for each data chunk and to send the requests to the corresponding storage devices. The requests include the GFID from the IO command, an identifier of the requested data chunk, and the timestamp assigned to the IO command. In situations in which the IO command identifies an object that is stored (or partially stored) in a storage device not associated with the GFID in the GFID database 302, the processor unit 121 object storage system 120 may return an error message to the AI PU (e.g., through the NIC 122). The processor unit 121 of the object storage system 120 may process IO commands from the memory buffers 124a-h in an order determined based on priorities associated with the memory buffers 124a-h. Further, in some implementations, the processor unit 121 of the object storage system 120 may limit a rate at which requests are transmitted to a particular one of the storage devices 200a-d based on the bandwidth 428 associated with the storage device as identified by the GFID database 302.

The storage devices 200a-d (e.g., the processor units 205 of the storage devices 200a-d) may be configured to send data (e.g., data chunks) in an order determined based on timestamps included in associated requests. The storage devices 200a-d may send the data either directly to a requesting AI PU or to the object storage system 120 through the NIC 201. For example, the first storage device 200a may receive a request for a first data chunk through the NIC 201 of the first storage device 200a. The processor unit 205 of the first storage device 200a may insert the request into one of the staging buffers 202a-d based on a timestamp in the request. For example, a position in which the request is added to a staging buffer may be determined based on the timestamp such that requests included in the staging buffer are sorted in timestamp order.

Further, the staging buffer that the request is inserted into may be selected by the processor unit 205 based on a bandwidth (e.g., the bandwidth 428) associated with the GFID in the request. The request may be processed from the staging buffer (e.g., in an order based on a priority of the staging buffer) and send to the bus 206 to be sent to be received by the drive (e.g., one of the drives 208a-d) storing the requested data (e.g., data chunk).

The drive may return the data to the bus 206 to be output by the storage device 200 through the NIC 201 to the AI PU associated with the GFID. For example, the processor unit 205 may initiate transmission of a query to the GFID database 302 through the NIC 201 to identify which AI PU is associated with the request and then initiate transmission of data output by the drive to that AI PU through the NIC 201. In some implementations, the storage device 200 sends the data (e.g., the data chunk) to the object storage system 120 for forwarding to the AI PU.

In some implementations, the processor unit 205 adds the data to one of the staging buffers 202a-d associated with buffering output. The data may be added to the staging buffer based on the GFID and/or timestamp associated with the request. Further, in some implementations, the processor unit 205 may limit a rate at which data is returned to the AI PU based on the bandwidth indicator 412 associated with the AI PU as identified by the GFID database 302.

Because the storage devices process requests and output data in timestamp order, objects may be retrieved in a synchronized fashion. Further, the timestamps may be assigned based on priorities (e.g., bandwidths) corresponding to GFIDs identifying AI training sessions. Accordingly, AI training sessions may be prioritized. Further, data rates between components within an AI training session may be managed based on bandwidths linked to a GFID of the AI training session.

Figure 5:
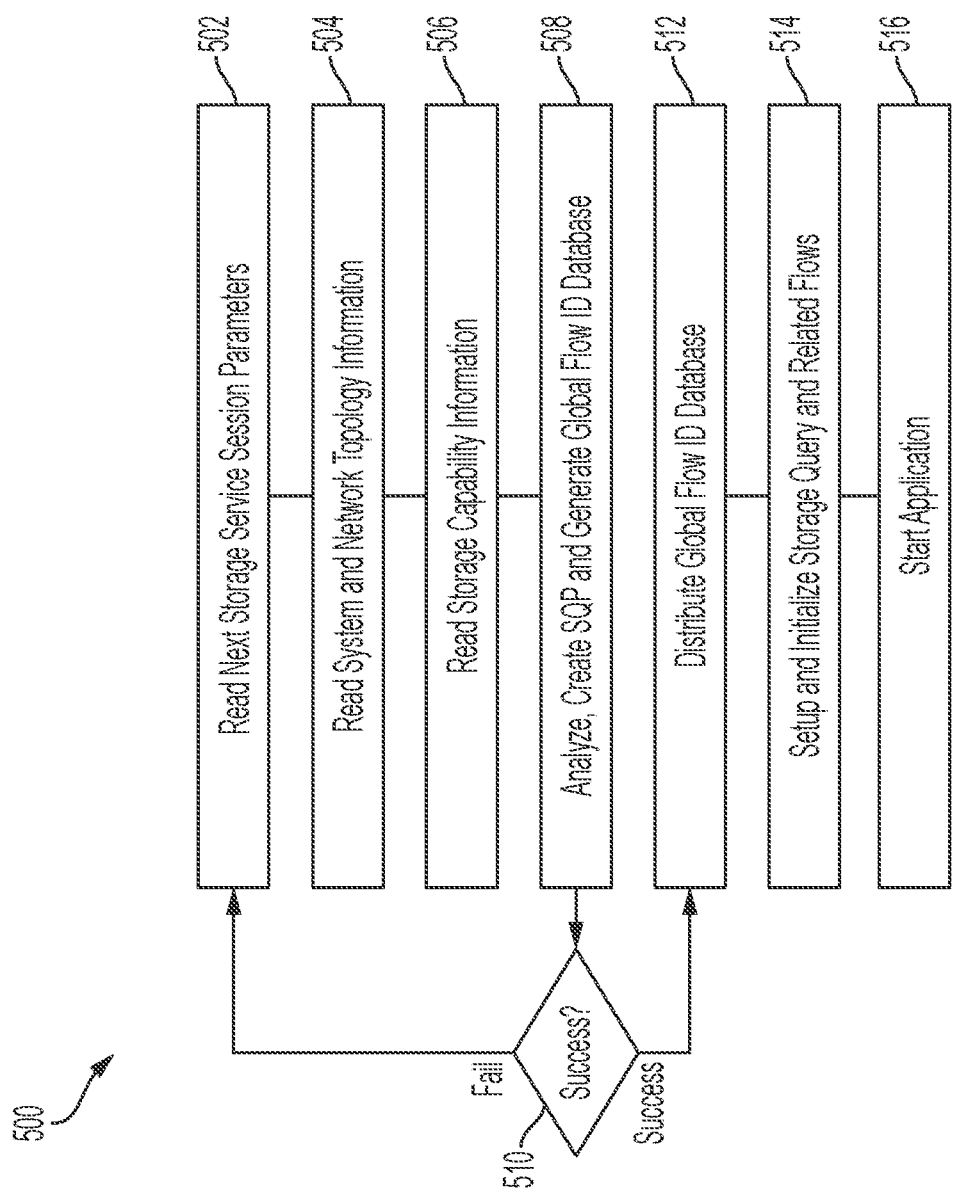
FIG. 5 is a flowchart illustrating a method for constructing a storage query plan.

Referring to FIG. 5, a flowchart illustrating a method 500 of generating a storage query plan for an AI training session is shown. The method 500 may be performed by the AI host device 102 of FIG. 1.

The method includes reading next storage service session parameters, at 502. For example, the AI host device 102 may read parameters (e.g., workload parameters) associated with an AI training session (e.g., from an input file or other source). These parameters may include a target bandwidth for the AI training session, a dataset, training time, bandwidth per GPU, objects/data to read, number of GPUs, size of a pre-fetch buffer other parameters, or a combination thereof. The parameters may be input by the data loader 110.

The method 500 further includes reading system and network topology information, at 504. For example, the AI host device 102 may determine a network topology of the system illustrated in FIG. 3. The AI host device 102 may determine the network topology using Internet control message protocol (ICMP), a link layer discovery protocol (LLDP), another tool, or a combination thereof. Determining the network topology information may further include determining bandwidth available at various devices in the network. For example, the AI host device 102 may determine available bandwidths of the storage devices 200, an available bandwidth of the object storage system 120, available bandwidths of the AI PUs 112a-h, or a combination thereof.

The method 500 further includes reading storage capability information, at 506. For example, the AI host device 102 may query the storage devices 200a-d, the object storage system 120, or a combination thereof to determine a storage capacity available for the AI training session.

The method 500 further includes analyzing the network information and the storage capability information and generating a global flow database entry associating a GFID to resources associated with the AI training session, at 508.

In response to determining, at 510, that the topology and storage capability do not support the storage system parameters, the method 500 includes reading next storage service session parameters, at 502.

In response to determining, at 510, that the topology and storage capability do support the storage system parameters, the method 500 includes distributing the global flow database entry, at 512. For example, the AI host device 102 may distribute the database entry to the GFID database 302.

The method 500 further includes setting up and initializing storage queries and related flows, at 514. For example, the AI host device 102 may initialize a connection with the object storage system 120. This connection may have a bandwidth indicated by the entry stored in the GFID database 302. The AI host device 102 may further initialize connections with one or more storage devices identified by the GFID database entry.

The method 500 further includes starting an application, at 516. For example, the AI host device 102 may start the AI application 108 and begin issuing IO commands to the object storage system 120 as part of the AI training session.

Figure 6:
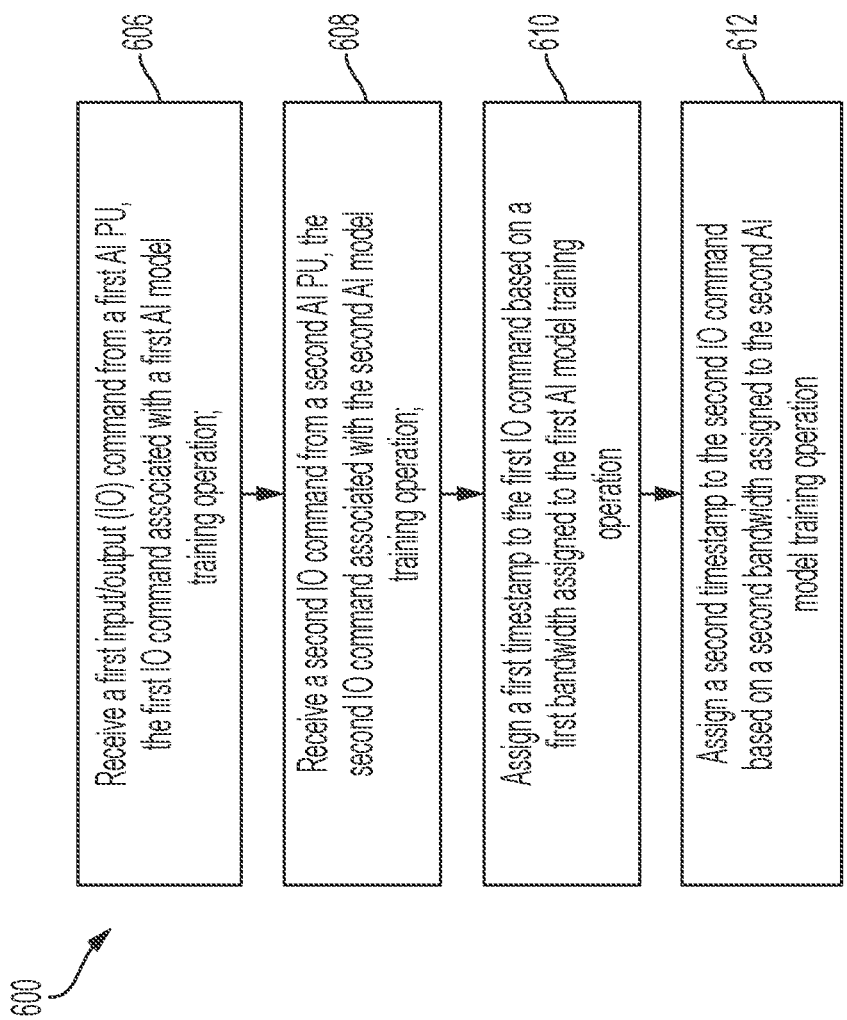
FIG. 6 is a flowchart illustrating a method for assigning timestamps to IO requests.

Referring to FIG. 6, a flowchart illustrating a method 600 of sending time synchronized requests to a storage device is shown. The method 600 may be performed by an object storage system, such as the object storage system 120, or by another type of storage system.

The method 600 includes receiving a first input/output (IO) command from a first AI PU, the first IO command associated with a first AI model training operation, at 606. For example, the object storage system 120 may receive a first IO command from the first AI PU 112a through the NIC 122. The first IO command may include a first GFID associated with a first AI training session performed by the first AI PU 112a.

The method 600 further includes receiving a second IO command from a second AI PU, the second IO command associated with a second AI model training operation, at 608. For example, the object storage system 120 may receive a second IO command from the second AI PU 112b through the NIC 122. The second IO command may include a second GFID associated with a second AI training session performed by the second AI PU 112b.

The method 600 further includes assigning a first timestamp to the first IO command based on a first bandwidth assigned to the first AI model training operation, at 610. For example, the processor unit 121 of the object storage system 120 may query the GFID database 302 to determine a first bandwidth indicator 412 associated with the GFID included in the first IO command. The processor unit 121 of the object storage system 120 may assign a first timestamp to the first IO command based on the identified first bandwidth. In some examples, the first timestamp corresponds to a time of receipt of the first IO command at the object storage system 120 plus an offset determined based on the first bandwidth.

The method 600 further includes assigning a second timestamp to the second IO command based on a second bandwidth assigned to the second AI model training operation, at 612. For example, the object storage system 120 may query the GFID database 302 to determine a second bandwidth indicator 412 associated with the GFID included in the second IO command. The processor unit 121 of the object storage system 120 may assign a second timestamp to the first IO command based on the identified second bandwidth. In some examples, the second timestamp corresponds to a time of receipt of the second IO command at the object storage system 120 plus an offset determined based on the second bandwidth.

Data requests sent by the object storage system 120 based on an IO command may include the timestamp assigned to the IO command. Storage devices that receive the data requests may output data in an order determined based on the timestamps. Accordingly, data may be output by the storage devices in a time synchronized manner.

Figure 7:
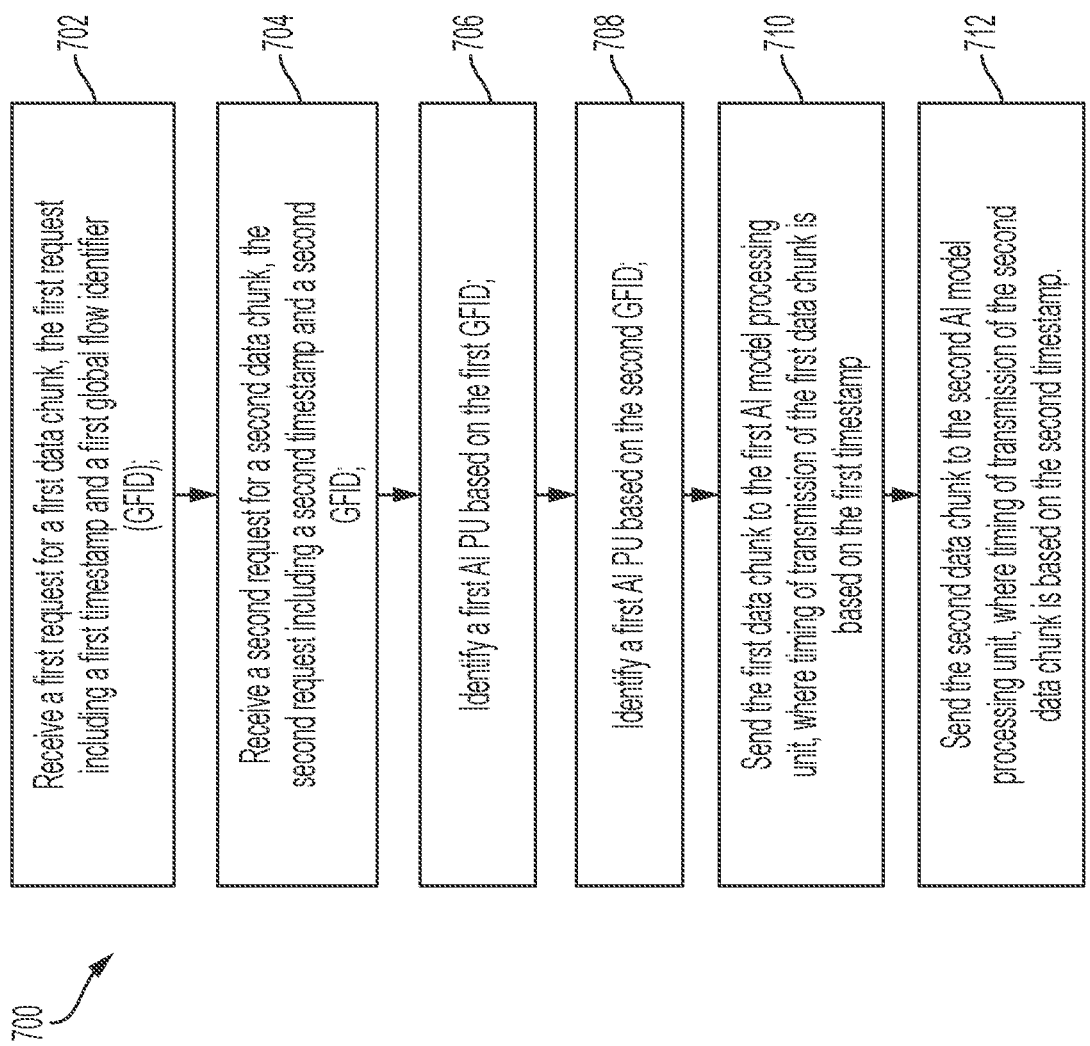
FIG. 7 is a flowchart illustrating a method for outputting data in response to IO requests.

Referring to FIG. 7, a flowchart illustrating a method 700 of transmitting data from a storage device in a time synchronized manner is shown.

The method 700 includes receiving a first request for a first data chunk, at 702. The first request includes a first timestamp and a first global flow identifier (GFID). For example, the first storage device 200a may receive a first request from the object storage system 120 through the NIC 201. The first request may request a first data chunk, include a first timestamp, and include a first GFID.

The method 700 further includes receiving a second request for a second data chunk, the second request including a second timestamp and a second GFID, at 704. For example, the first storage device 200a may receive a second request from the object storage system 120 through the NIC 201. The second request may request a second data chunk, include a second timestamp, and include a second GFID.

The method 700 further includes identifying a first AI PU based on the first GFID, at 706. For example, the processor unit 205 of the first storage device 200a may query the GFID database 302 through the NIC 201 to determine that the first AI PU 112a is associated with the first GFID.

The method 700 further includes identifying a second AI model processing unit based on the second GFID, at 708. For example, the processor unit 205 of the first storage device 200a may query the GFID database 302 through the NIC 201 to determine that the second AI PU 112b is associated with the second GFID.

The method 700 further includes sending the first data chunk to the first AI PU, where timing of transmission of the first data chunk is based on the first timestamp, at 710. For example, the processor unit 205 of the first data storage device 200a may initiate transmission of the first data chunk to the first AI PU 112a through the NIC 201. The processor unit 205 of the first data storage device 200a may schedule processing of the first request from one of the staging buffers 202a-d and/or schedule transmission of the first data chunk to the first AI PU 112a based on the first timestamp. In some implementations, the processor unit 205 of the first storage device 200a waits until time indicated by the first timestamp to transmit the first data chunk to the first AI PU 112a.

The method 700 further includes sending the second data chunk to the second AI model processing unit, wherein timing of transmission of the second data chunk is based on the second timestamp, at 712. For example, the processor unit 205 of the first data storage device 200a may initiate transmission of the second data chunk to the second AI PU 112b through the NIC 201. The processor unit 205 of the first data storage device 200a may schedule processing of the second request from one of the staging buffers 202a-d and/or schedule transmission of the second data chunk to the first AI PU 112a based on the second timestamp. In some implementations, the processor unit 205 of the first storage device 200a waits until time indicated by the second timestamp to transmit the second data chunk to the first AI PU 112a.

Thus, the method 700 may be used by a storage device to transmit data chunks in a time synchronized manner. Since the timestamps used by the data storage device to synchronize transmission may be based on AI training session priority, the transmission of data may take into account relative priorities of AI training sessions.

Figure 8:
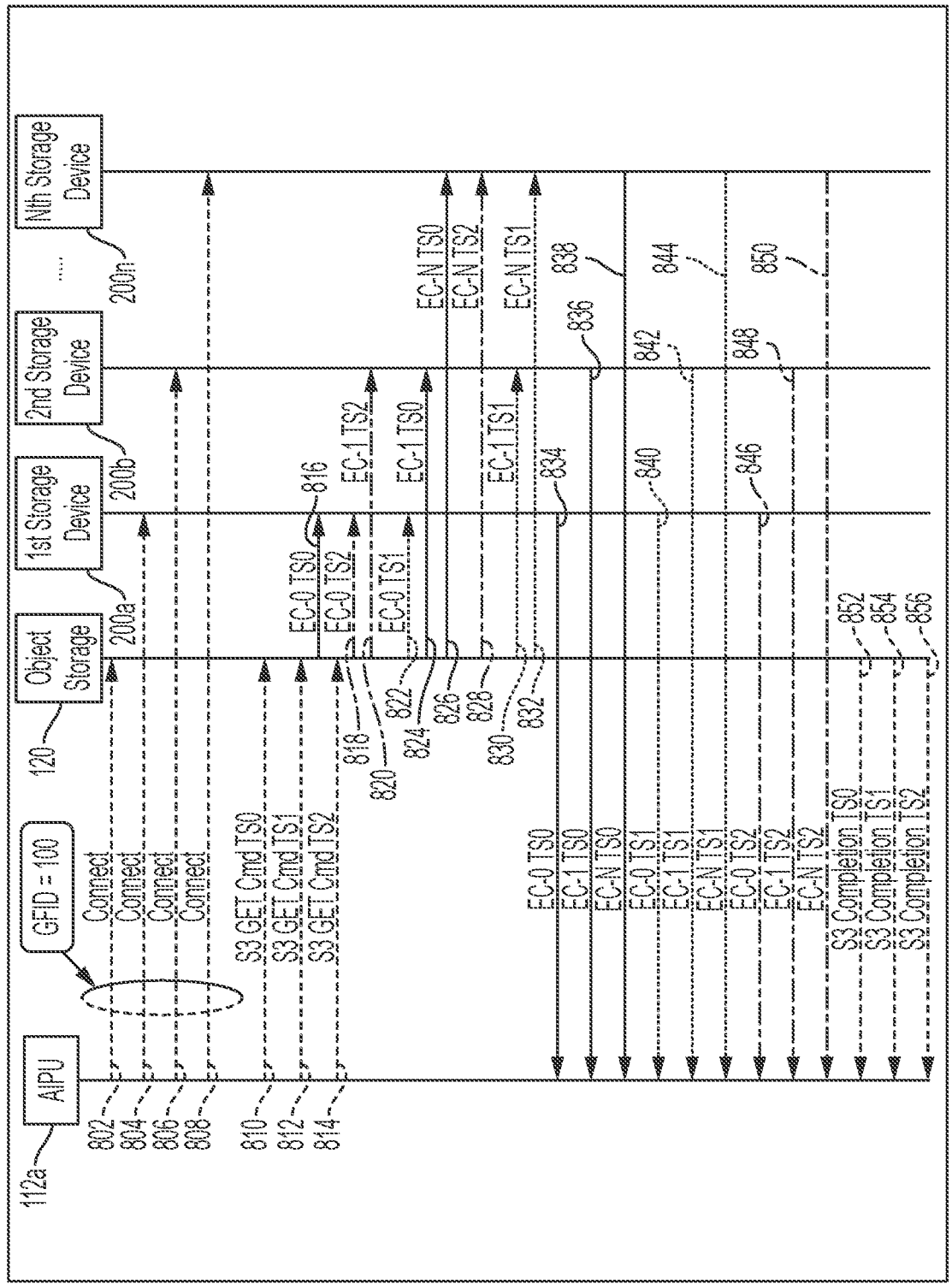
FIG. 8 is a sequence diagram illustrating synchronized processing of IO commands.

Referring to FIG. 8, a sequence diagram 800 illustrating an example in which the first AI PU 112a issues three IO commands for a particular AI trainings session is shown. The sequence diagram illustrates first to nth storage devices 200a-n. As explained above, the system of FIG. 3 may include a different number of storage devices than the four shown.

The sequence includes the first AI PU 112a connecting to the object storage system 120, at 802. The first AI PU 112a may initiate this connection in response to determining that a storage query plan has successfully been established for an AI training session and that storage query plan assigns the object storage system 120 to the AI training session. In the illustrated example, the AI training session has a GFID of "ABC". Accordingly, the GFID database 302 stores a GFID database entry associating GFID "ABC" with the object storage system 120.

The sequence includes the first AI PU 112a connecting to the first storage device 200a, at 804. The first AI PU 112a may initiate this connection in response to determining that the storage query plan assigns the first storage device 200a to the AI training session. The GFID database entry associates GFID "ABC" with the first storage device 200a.

The sequence includes the first AI PU 112a connecting to the second storage device 200b, at 806. The first AI PU 112a may initiate this connection in response to determining that the storage query plan assigns the second storage device 200b to the AI training session. The GFID database entry associates GFID "ABC" with the second storage device 200b.

The sequence includes the first AI PU 112a connecting to the nth storage device 200n, at 808. The first AI PU 112a may initiate this connection in response to determining that the storage query plan assigns the nth storage device 200n to the AI training session. The GFID database entry associates GFID "ABC" with the nth storage device 200n.

The sequence 800 further includes the AI PU 112a sending a first IO command to the object storage system 120, at 810, sending a second IO command to the object storage system 120, at 812, and sending a third IO command to the object storage system 120, at 814. In the illustrated example, the first, second, and third IO commands are GET commands. The first IO command identifies a first data object (e.g., by a key value), the second IO command identifies a second data object, and the third IO command identifies a third data object. The object storage system 120 assigns a first timestamp to the first IO command, assigns a second timestamp to the second IO command, and assigns a third timestamp to the third command. The timestamps are generated based on a priority (e.g., a bandwidth) associated with the GFID "ABC" in the GFID database 302.

For each command, the object storage system 120 then generates requests for data chunks associated with the object identified by the IO command. The requests include the timestamp assigned to the IO command and are sent by the object storage system 120 to storage devices identified in the GFID database 302 as being associated with the GFID "ABC".

In the illustrated example of FIG. 8, the object storage system 120 generates a first request for a data chunk, a second request for a data chunk, and a third request for a data chunk based on the first IO command. Each of these requests includes the first timestamp assigned to the first IO command. The object storage system 120 further generates a fourth request for a data chunk, a fifth request for a data chunk, and a sixth request for a data chunk based on the second IO command. Each of these requests includes the second timestamp assigned to the second IO command. The object storage system 120 further generates a seventh request for a data chunk, an eighth request for a data chunk, and a ninth request for a data chunk based on the third IO command. Each of these requests includes the third timestamp assigned to the third IO command.

In the sequence diagram 800, the object storage system 120 sends the first request to the first storage device 200a, at 816, sends the seventh request to the first storage device 200a, at 818, sends the eighth request to the second storage device 200b, at 820, sends the fourth request to the first storage device 200a, at 822, sends second request to the second storage device 200b, at 824, sends the third request to the nth storage device 200n, at 826, sends the ninth request to the nth storage device 200n, at 828, sends the fifth request to the second storage device 200b, at 830, and sends the sixth request to the nth storage device 200n, at 832. Thus, the requests may be sent by the object storage system 120 (and received by the storage devices 200a-n) out of order.

The storage devices 200a-n are configured to output data chunks in an order determined based on the timestamps included in the requests. For example, the first storage device 200a may receive the first request, the fourth request, and the seventh request, insert the first request, the fourth request, and the seventh request in the first staging buffer 202a in a sequence based on the respective timestamps (which may be different from a sequence in which the corresponding requests were received), then process the requests from the first staging buffer 202a in an order based on the sequence. In addition or in the alternative, the first storage device 200a may insert data associated with the first request, data associated with the fourth request, and data associated with the seventh request into the second staging buffer 202b in a sequence based on the timestamps and then transmit the data chunks from the second staging buffer 202b in an order based on the sequence. In some implementations, a data chunk is removed from the staging buffer 202b and transmitted to the first AI PU 112a at a time (or approximately at a time (e.g., within 3 ms)) indicated by the timestamp associated with the data chunk.

Thus, in the illustrated sequence 800, a data chunk responsive to the first request is output to the first AI PU 112a, at 834, a data chunk associated with the second request is output to the first AI PU 112a, at 836, a data chunk associated with the third request is output to the first AI PU 112a, at 838, a data chunk associated with the fourth request is output to the first AI PU 112a, at 840, a data chunk associated with the fifth request is output to the first AI PU 112a, at 842, a data chunk associated with the sixth request is output to the first AI PU 112a, at 844, a data chunk associated with the seventh request is output to the first AI PU 112a, at 846, a data chunk associated with the eighth request is output to the first AI PU 112a, at 848, and a data chunk associated with the ninth request is output to the first AI PU 112a, at 850. It should be noted that in addition to determining a sequence in which data is returned, the timestamps set by the object storage system 120 determine rates at which data is delivered to the AI PUs. Accordingly, data chunks returned to the first AI PU 112a may be time synchronized and delivered at appropriate rates.

In the illustrated example, the object storage system 120 transmits a first completion notification to the first AI PU 112a, at 852, transmits a second completion notification to the first AI PU 112a, at 854, and transmits a third completion notification to the first AI PU 112a, at 856. The completion notifications may be transmitted based on times associated with the timestamps. For example, the first completion notification may be transmitted by the object storage system 120 at a time indicated by the first timestamp. Thus, the first AI PU 112a may be notified that all data chunks associated with the first IO command should have been transmitted.

Figure 9:
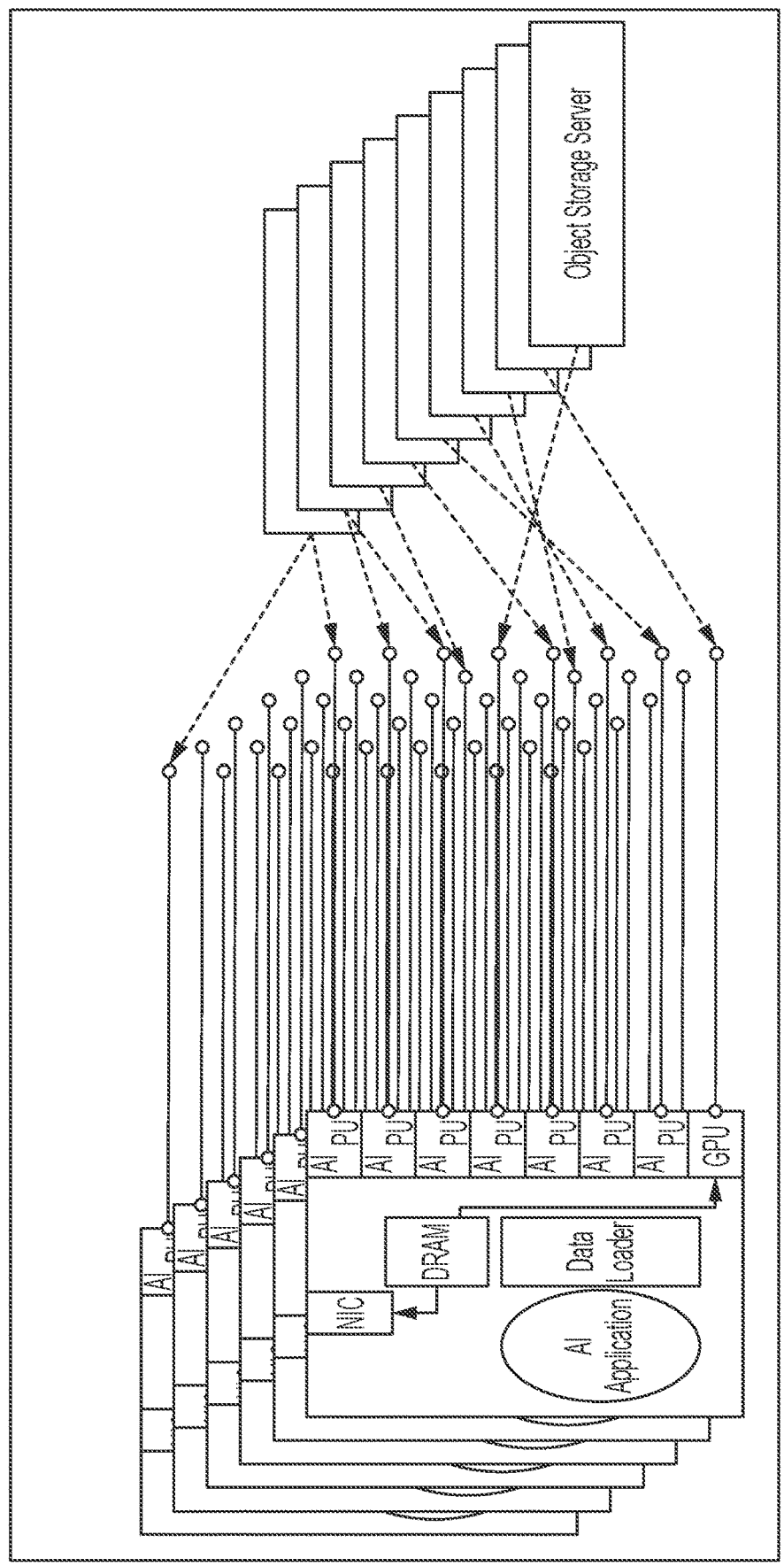
FIG. 9 is a diagram illustrating a system that includes multiple artificial intelligence host devices and multiple object storage systems.

The examples described above describe implementations in which one AI host device interacts with one object storage system. However, a system may include more than one AI host device and more than one object storage system. More than one AI host device may interact with an object storage system. Further, an AI host device may interact with more than one object storage system. An example system that includes many AI host devices and many object storage systems is illustrated in FIG. 9. The makeup and operation of the system of FIG. 9 may be analogous to the systems and operations described above with reference to FIGS. 1-8.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes or method steps may be performed substantially at the same time or performed in a different order than the described order.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

What is claimed is:

1. A method comprising:
receiving, at a first computing device, a first input/output (IO) command from a first artificial intelligence processing unit (AI PU), the first IO command associated with a first AI model training operation;
receiving, at the first computing device, a second IO command from a second AI PU, the second IO command associated with a second AI model training operation;
assigning a first timestamp to the first IO command based on a first bandwidth assigned to the first AI model training operation; and
assigning a second timestamp to the second IO command based on a second bandwidth assigned to the second AI model training operation.

2. The method of claim 1, wherein the first command includes a first global flow identifier (GFID) identifying the first AI model training operation and the second command includes a second GFID identifying the second AI model training operation, wherein the method further includes:
retrieving an indication of the first bandwidth associated with the first AI model from a database based on the first GFID; and
retrieving an indication of the second bandwidth associated with the second AI model from the databased based on the second GFID.

3. The method of claim 1, further comprising sending a first request for a first chunk of data to a first storage device based on the first IO command, the first request including the first timestamp.

4. The method of claim 3, further comprising sending a second request for a second chunk of data to a second storage device based on the first IO command, the second request including the first timestamp.

5. The method of claim 4, further comprising sending a third request for a third chunk of data to a third storage device based on the second IO command, the third request including the second timestamp.

6. The method of claim 3, wherein the first IO command identifies a data object, and wherein the first chunk corresponds to a first erasure coded chunk of the data object and the second chunk corresponds to a second erasure coded chunk of the data object.

7. The method of claim 3, wherein the first storage device corresponds to a non-volatile memory express over fabric (NVMe-oF) target.

8. A method comprising:
receiving, at a storage device, a first request for a first data chunk, the first request including a first timestamp and a first global flow identifier (GFID);
receiving, at the storage device, a second request for a second data chunk, the second request including a second timestamp and a second GFID;
identifying, at the storage device, a first artificial intelligence (AI) model processing unit based on the first GFID;
identifying, at the storage device, a second AI model processing unit based on the second GFID;
sending, from the storage device, the first data chunk to the first AI model processing unit, wherein timing of transmission of the first data chunk is based on the first timestamp; and
sending, from the storage device, the second data chunk to the second AI model processing unit, wherein timing of transmission of the second data chunk is based on the second timestamp.

9. The method of claim 8, wherein the storage device includes a non-volatile memory express over fabric (NVMe-oF) target, wherein the NVMe-oF target includes a plurality of solid state drives (SSDs).

10. The method of claim 8, wherein the first AI model processing unit includes a graphics processor unit.

11. The method of claim 8, wherein the first AI model processing unit includes an application executing on a processor.

12. The method of claim 8, wherein the first data chunk corresponds to an erasure coded chunk of a data object.

13. The method of claim 8, wherein the first data chunk is transmitted before the second data chunk in response to the first timestamp preceding the second timestamp.

14. The method of claim 8, wherein identifying the first AI model processing unit includes sending a query identifying the first GFID to a GFID database.

15. A computing device comprising:
a network interface; and
a processor unit configured to:
receive a first input/output (IO) command from a first artificial intelligence processing unit (AI PU), the first IO command associated with a first AI model training operation;
receive a second IO command from a second AI PU, the second IO command associated with a second AI model training operation;
assign a first timestamp to the first IO command based on a first bandwidth assigned to the first AI model training operation; and
assign a second timestamp to the second IO command based on a second bandwidth assigned to the second AI model training operation.

16. The computing device of claim 15, wherein the first command includes a first global flow identifier (GFID) identifying the first AI model training operation and the second command includes a second GFID identifying the second AI model training operation, wherein the processor unit is further configured to:
retrieve an indication of the first bandwidth associated with the first AI model from a database based on the first GFID; and
retrieve an indication of the second bandwidth associated with the second AI model from the databased based on the second GFID.

17. The computing device of claim 15, wherein the processor unit is further configured to initiate transmission through the network interface of a first request for a first chunk of data to a first storage device based on the first IO command, the first request including the first timestamp.

18. The computing device of claim 17, wherein the processor unit is further configured to initiate transmission through the network interface of a second request for a second chunk of data to a second storage device based on the first IO command, the second request including the first timestamp.

19. The computing device of claim 18, wherein the processor unit is further configured to initiate transmission through the network interface of a third request for a third chunk of data to a third storage device based on the second IO command, the third request including the second timestamp.

20. The computing device of claim 17, wherein the first IO command identifies a data object, and wherein the first chunk corresponds to a first erasure coded chunk of the data object and the second chunk corresponds to a second erasure coded chunk of the data object.

21. The computing device of claim 17, wherein the first storage device corresponds to a non-volatile memory express over fabric (NVMe-oF) target.

22. A storage device comprising:
a network interface; and
a processor unit configured to:
receive a first request for a first data chunk, the first request including a first timestamp and a first global flow identifier (GFID);
receive a second request for a second data chunk, the second request including a second timestamp and a second GFID;
identify a first artificial intelligence (AI) model processing unit based on the first GFID;
identify a second AI model processing unit based on the second GFID;
initiate transmission of the first data chunk to the first AI model processing unit through the network interface, wherein timing of transmission of the first data chunk is based on the first timestamp; and
initiate transmission of the second data chunk to the second AI model processing unit through the network interface, wherein timing of transmission of the second data chunk is based on the second timestamp.

23. The storage device of claim 22, wherein the storage device includes a non-volatile memory express over fabric (NVMe-oF) target that includes a plurality of solid state drives (SSDs).

24. The storage device of claim 22, wherein the first data chunk corresponds to an erasure coded chunk of a data object.

25. The storage device of claim 22, wherein the first data chunk is transmitted before the second data chunk in response to the first timestamp preceding the second timestamp.

26. The storage device of claim 22, wherein identifying the first AI model processing unit includes sending a query identifying the first GFID to a GFID database.

* * * * *